US011270185B1

(12) United States Patent
Ouyang et al.

(10) Patent No.: US 11,270,185 B1
(45) Date of Patent: Mar. 8, 2022

(54) METHODS, SYSTEMS, AND COMPUTER PROGRAM PRODUCT FOR GENERATING A PERSONALIZED FLOW FOR A SOFTWARE DELIVERY MODEL

(71) Applicant: INTUIT INC., Mountain View, CA (US)

(72) Inventors: Peter P. Ouyang, Del Mar, CA (US); Christopher R. Rivera, Carlsbad, CA (US); Joseph B. Cessna, San Diego, CA (US)

(73) Assignee: INTUIT INC., Mountain View, CA (US)

( * ) Notice: Subject to any disclaimer, the term of this patent is extended or adjusted under 35 U.S.C. 154(b) by 1390 days.

(21) Appl. No.: 15/417,758

(22) Filed: Jan. 27, 2017

(51) Int. Cl.
*G06N 3/00* (2006.01)
*G06N 20/00* (2019.01)
*G06F 16/35* (2019.01)
*G06F 30/20* (2020.01)
*G06F 40/40* (2020.01)

(52) U.S. Cl.
CPC ............ *G06N 3/004* (2013.01); *G06F 16/35* (2019.01); *G06F 30/20* (2020.01); *G06F 40/40* (2020.01); *G06N 20/00* (2019.01)

(58) Field of Classification Search
CPC ........ G06N 3/004; G06N 20/00; G06F 16/35; G06F 17/28; G06F 17/5009
See application file for complete search history.

(56) References Cited

U.S. PATENT DOCUMENTS

| | | | |
|---|---|---|---|
| 5,822,741 A | 10/1998 | Fischthal | |
| 6,826,724 B1 | 11/2004 | Shimada | |
| 7,792,729 B2 | 9/2010 | Caballero | |
| 9,471,887 B2 * | 10/2016 | Shin | G06F 9/4881 |
| 9,760,953 B1 | 9/2017 | Wang | |
| 9,779,317 B2 | 10/2017 | Igarashi | |
| 9,892,106 B1 | 2/2018 | Lesner | |
| 9,916,628 B1 | 3/2018 | Wang | |
| 9,922,376 B1 | 3/2018 | Wang | |
| 9,959,560 B1 | 5/2018 | Whitaker | |
| 9,990,678 B1 | 6/2018 | Cabrera | |
| 10,013,721 B1 | 7/2018 | Laaser | |
| 2002/0013747 A1 | 1/2002 | Valentine | |
| 2004/0122755 A1 | 6/2004 | Bates | |
| 2007/0005509 A1 | 1/2007 | Spiller | |

(Continued)

OTHER PUBLICATIONS

U.S. Appl. No. 15/417,692, filed Jan. 27, 2017.
U.S. Appl. No. 15/417,947, filed Jan. 27, 2017.
U.S. Appl. No. 15/417,861, filed Jan. 27, 2017.

*Primary Examiner* — Austin Hicks
(74) *Attorney, Agent, or Firm* — DLA Piper LLP (US)

(57) ABSTRACT

Disclosed are techniques for generating a personalized flow for a software delivery model. These techniques identify user information expressed in natural language for a specific user. One or more user clusters may be determined for the specific user based on at least one user vector representation of a form of the user information. One or more personalized information clusters may be identified for a user cluster of the one or more user clusters based at least in part on the at least one user vector representation. A personalized software application flow may be generated and presented to the specific user by using at least the one or more personalized information clusters for the specific user.

24 Claims, 8 Drawing Sheets

(56) References Cited

U.S. PATENT DOCUMENTS

| | | |
|---|---|---|
| 2007/0271287 A1 | 11/2007 | Acharya |
| 2009/0248678 A1 | 10/2009 | Okamoto |
| 2010/0312726 A1 | 12/2010 | Thompson |
| 2011/0125700 A1 | 5/2011 | Funada |
| 2011/0231399 A1 | 9/2011 | Zhang |
| 2011/0249905 A1 | 10/2011 | Singh |
| 2014/0317019 A1 | 10/2014 | Papenbrock |
| 2014/0337189 A1 | 11/2014 | Barsade |
| 2015/0051948 A1 | 2/2015 | Aizono |
| 2015/0120782 A1 | 4/2015 | Kim |
| 2016/0042296 A1 | 2/2016 | Shan |
| 2017/0068722 A1 | 3/2017 | Wang |
| 2017/0147675 A1 | 5/2017 | Han |
| 2017/0195731 A1 | 7/2017 | Girlando |
| 2018/0052924 A1 | 2/2018 | Jagmohan |
| 2018/0097815 A1 | 4/2018 | Wang |
| 2018/0157800 A1* | 6/2018 | Ravishankar .......... G09B 23/28 |

* cited by examiner

METHODS, SYSTEMS, AND COMPUTER PROGRAM PRODUCT FOR GENERATING A PERSONALIZED FLOW FOR A SOFTWARE DELIVERY MODEL

CROSS-REFERENCE TO RELATED APPLICATIONS

The present application is related to U.S. application Ser. No. 15/417,692, filed Jan. 27, 2017, entitled "METHODS, SYSTEMS, AND COMPUTER PROGRAM PRODUCT FOR IMPLEMENTING CLUSTER-BASED PROCESSING OF DIGITAL FORMS WITH WORD EMBEDDING TECHNIQUES", U.S. application Ser. No. 15/417,861, filed Jan. 27, 2017, entitled "METHODS, SYSTEMS, AND COMPUTER PROGRAM PRODUCT FOR PROVIDING EXPENSE INFORMATION FOR AN ELECTRONIC TAX RETURN PREPARATION AND FILING SOFTWARE DELIVERY MODEL", and U.S. application Ser. No. 15/417,947, filed Jan. 27, 2017, entitled "METHODS, SYSTEMS, AND COMPUTER PROGRAM PRODUCT FOR PERFORMING ANALYTICS AND ANONYMIZATION OF DATA RECORDS OF FINANCIAL MANAGEMENT SOFTWARE PROGRAMS". The contents of the aforementioned patent applications are hereby expressly incorporated by references in their entireties for all purposes.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Conventional software application delivery models involving user interactions (e.g., users providing inputs in the form of natural language) often present a statically coded flows for all users. In order to accommodate possible usage patterns, these conventional software application delivery models usually include flow nodes that are relevant for a segment of users but irrelevant for another segment of users. In addition, certain users may have unique requirements or usage patterns that may not necessarily be captured in these default, statically coded flow nodes.

Certain software application delivery models rely on users' inputs to derive subsequent recommendations or to arrange these users' inputs in appropriate fields to complete form processing. Nonetheless, users may not necessarily be aware of what information users may provide or whether the users provide the information correctly. When presented with such standard software application flows, users usually skip many sections, screens, or flow nodes that the users believe are irrelevant or are inadvertently and mistakenly discarded due to users' misunderstanding of these sections, screens, or flow nodes or lack of understanding or knowledge.

For example, conventional tax return preparation and filing software applications present a static and non-personalized list or flow to all users. Due to the numerous types of expenses and deduction types businesses may claim, conventional approaches either present too many expense categories that are irrelevant to some users' specific businesses or present some common categories while leaving out significant categories that are more pertinent to certain users. Without the aid of tax or accounting experts, some users may not even be aware of the legitimate deductions that can be entered.

Therefore, there exists a need for a method, system, and computer program product for generating a personalized flow to address at least the aforementioned shortcomings of conventional approaches.

SUMMARY

Disclosed are method(s), system(s), and article(s) of manufacture for generating a personalized flow for a software delivery model in various embodiments.

Some embodiments are directed to a method for generating a personalized flow for a software delivery model. In these embodiments, user information expressed in natural language for a specific user may be identified. One or more user clusters may be determined for the specific user based on at least one user vector representation of a form of the user information. One or more personalized information clusters may be identified for a user cluster of the one or more user clusters based at least in part on the at least one user vector representation. A personalized software application flow may be generated and presented to the specific user by using at least the one or more personalized information clusters for the specific user.

In some embodiments, the user information may be identified from the user computing device of the specific user through the computer network component; the user information may be normalized by one or more word embedding modules into normalized user information; and the at least one user vector representation may be generated for the normalized user information of the specific user.

In addition, additional user information of a plurality of users may be further identified; and the additional user information may be normalized into additional normalized user information. A plurality of user vector representations may be generated for the additional normalized user information of the plurality of users; and a plurality of user clusters may be determined by processing at least the plurality of user vector representations for the plurality of users at the one or more word embedding modules.

In some of the immediately preceding embodiments, characteristic information of a group of users in a user cluster of the one or more user clusters may be identified; and the characteristic information of the group of users in the user cluster may be transformed into a plurality of characteristic vector representations at least by normalizing the characteristic information into normalized characteristic information and vectorizing the normalized characteristic information.

In addition or in the alternative, one or more characteristic clusters for the group of users may be determined based in part or in whole upon the plurality of characteristic vector representations; and the one or more personalized information clusters may be identified for the specific user from the one or more characteristic clusters for the specific user. The one or more personalized information clusters may be optionally verified by presenting at least one interview session or a chat session to a user interface of the software delivery model.

In some embodiments, additional natural language information of the specific user may be identified and normalized into normalized additional natural language information; the normalized natural language information may be transformed into one or more additional vector representations; and the one or more personalized information clusters may be modified by determining an addition or removal of at least one personalized information cluster using at least the one or more additional vector representations for the addition natural language information.

In some embodiments, user information of a plurality of users stored in a central repository may be normalized into normalized user information; and a size of the user information or the normalized user information may be reduced by applying one or more data reduction techniques to the user information or the normalized user information.

In addition or in the alternative, a plurality of analogical reasoning tasks comprising one or more vector arithmetic operations, one or more additive compositionality operations, or one or more combinations of the one or more vector arithmetic operations and one or more additive compositionality operations may be identified; and one or more training instances may be determined with at least the plurality of analogical reasoning tasks. The one or more word embedding modules may be trained by executing the one or more training instances for the one or more word embedding modules in a supervised, unsupervised, or reinforcement learning environment.

In some embodiments, one or more corpora including user information and characteristic information of a plurality of users may be identified; a plurality of user vector representations may be identified (if already existing) or determined (if non-existing) for the user information in the one or more corpora; and a plurality of user clusters may be identified (if already existing) or determined (if non-existing) based in part or in whole upon the plurality of user vector representations for the user information in the one or more corpora. A plurality of characteristic vector representations may be similarly identified or determined for the characteristic information in the one or more corpora; and a plurality of characteristic clusters may also be similarly identified or determined for at least one user cluster of the plurality of user clusters based in part or in whole upon the plurality of characteristic vector representations for the characteristic information in the one or more corpora.

In some of these immediately preceding embodiments, one or more objective tokens may be identified; the one or more objective tokens may be transformed into one or more objective vector representations at the one or more word embedding modules; similarity scores between the one or more objective vector representations and at least some of the plurality of characteristic vector representations may be determined; one or more target user clusters may be identified based in part or in whole upon the similarity scores; and at least one target user cluster of the one or more target user clusters and corresponding characteristic information may be aggregated into an aggregated result set.

In some embodiments, a software flow configuration module in the software delivery model may be invoked; a default software application flow comprising a set of default flow nodes may be identified for the software application delivery model; and the default software flow may be modified at least by adding one or more flow nodes that correspond to the one or more personalized information clusters to the default software application flow, wherein the one or more flow nodes includes an interview screen or a chat session encompassing information about the one or more personalized information clusters. In some of these embodiments, the default software application flow may be modified at least by removing one or more default flow nodes from the default software application flow.

Some embodiments are directed at one or more hardware modules that include and/or function in conjunction with at least one micro-processor as well as other related components or architectures of one or more computing systems and may be invoked to perform any of the methods, processes, or sub-processes disclosed herein. The hardware system may include, for example, a normalization module, one or more word embedding modules, one or more multi-stage clustering modules, a profiler module, an analytics module, an anonymization module, one or more machine learning or artificial intelligence (A.I.) modules, and/or an anomaly check module as described in more details below in some embodiments.

Each of these modules may include or function in tandem with electrical circuitry and one or more micro-processors each having one or more processor cores to perform its intended functions. The hardware system may further include one or more forms of non-transitory machine-readable storage media or persistent storage devices to temporarily or persistently store various types of data or information, various design rules, various libraries, selected and selectable targets, or any other suitable information or data, etc. A module may be initialized in a computing system so that the software portion of the module is stored in memory (e.g., random access memory) to be executed by one or more processors or processor cores off the computing system to perform at least a part of the functionality of the module. Some illustrative modules or components of the hardware system may be found in the description below with reference to FIGS. 6A-6B.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for generating a personalized flow for a software delivery model are described below with reference to FIGS. 1-6B.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
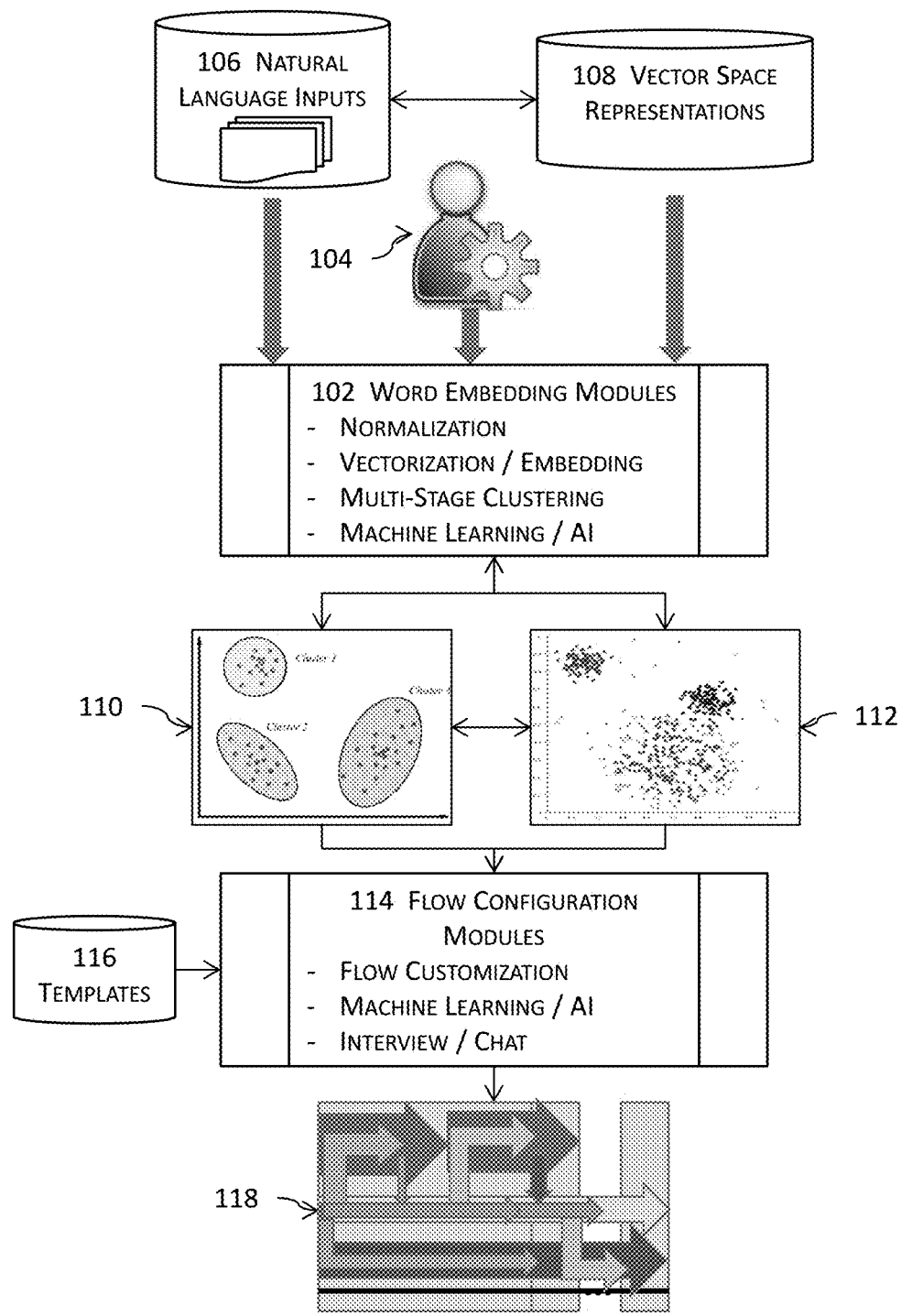
FIG. 1 illustrates a high level block diagram for generating a personalized flow for a software delivery model in one or more embodiments.

Various embodiments are directed to a method, system, and computer program product for generating a personalized flow for a software delivery model. Other objects, features, and advantages of the invention are described in the detailed description, figures, and claims.

In these embodiments, user information (e.g., description of users' business or profession) and characteristics (e.g., description of users' expenses claimed in tax returns) of a plurality of users may be embedded into a vector space for a software application delivery model (e.g., an electronic tax return preparation and filing software delivery model). The plurality of users may be classified into a plurality of user clusters (e.g., business clusters or profession clusters) with word embedding techniques. Each user cluster thus includes a group of similar users according to their respective user information. For each user cluster, users' characteristics (e.g., description of expenses) may also be classified into a plurality of characteristic clusters (e.g., expense categories, etc.) using the word embedding techniques. Each characteristic cluster thus represents similar characteristics.

When a specific user accesses the software application delivery model, the specific user may provide specific user information into the software application delivery model. This specific user information may also be embedded into the same vector space. With this embedded specific user information, the specific user may be determined to belong to one or more specific user clusters. One or more characteristic clusters that are more common to these one or more specific user clusters may be identified for the specific user. These one or more characteristic clusters may be treated as personalized information clusters for the specific user because these one or more characteristic clusters have been determined to be similar to each other for a group of users to which the specific user also belongs.

Strictly as an example, a user may access an electronic tax return preparation and filing software delivery model and provides some description of his business. This business description may be transformed into a business description vector in the same vector space that also corresponds to a plurality of other business descriptions of a plurality of other users. The business description vector of the specific user may then be clustered into one or more business clusters, each corresponding to a respective set of expense categories. Once the business clusters are determined for the specific user, one or more expense categories associated with these business clusters, into which the specific user is clustered, may be identified as one or more personalized expense categories for the specific's user's tax return. For example, one or more expense category that most number of user in a user cluster claim may be identified as one or more personalized expense categories for the specific user. As another example, one or more expense categories that correspond to a number of highest average expense amounts for a user cluster may be identified as one or more personalized expense categories for the specific user.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

FIG. 1 illustrates a high level block diagram for generating a personalized flow for a software delivery model in one or more embodiments. In these embodiments, a corpus 106 including natural language or free text data items may be provided to and processed by a plurality of modules 102. The plurality of modules 102 may perform various tasks such as normalization tasks, word vectorization and embedding tasks, multi-stage clustering tasks, etc. on the corpus 106 to transform the corpus into a set of vector space representations 108.

The set of vector space representations 108 may be further processed by the plurality of modules 102 that perform a first stage clustering process on the vector space representations 108 of the corpus 106 to generate a plurality of user clusters 110 where similar users are clustered into the same user cluster (e.g., user vector representations in closer proximity). For a user cluster, the plurality of word embedding modules 102 may further perform a second stage clustering process that classifies a plurality of characteristics of a user cluster into one or more characteristic clusters 112. Similar to user clusters, a characteristic cluster corresponds to similar characteristics (or characteristic vector representations in closer proximity).

The plurality of word embedding modules 102 thus classify a plurality of users into one or more user clusters each including similar users, and for a user cluster, further cluster a plurality of characteristics associated with the users in the user cluster into one or more characteristic clusters each comprising similar characteristics. For example, a plurality of users accessing an electronic tax return preparation and filing software application delivery model may each enter his description of business or profession in Schedule C of Form 1040 and further provide natural language description of other expenses. The word embedding modules described herein may first cluster these users into a plurality of user clusters (e.g., musicians, sports coaches, accountants, building contractors, etc.) by normalizing, vectorizing, and clustering the natural language description of the businesses or professions provided by these users.

For a user cluster encompassing multiple similar users whose description of businesses or professions is determined to be similar, the word embedding modules may further normalize, vectorize, and cluster the natural language entries for "Other Expenses" in Schedule C of Form 1040 into a plurality of characteristic clusters (e.g., expense categories). These characteristic clusters may be ranked or ordered based on one or more criteria including, for example, the percentage of users claiming the expenses in a particular characteristic cluster, the amounts (e.g., average amounts, maximum amounts, other suitable amounts, etc.) of expenses claimed, the number of users claiming expenses in a specific characteristic cluster, etc.

It shall be noted that although the present disclosure refers to the electronic tax return preparation and filing software delivery model in various embodiments and examples, the techniques described herein are not limited as such. These techniques described herein may apply with full and equal effects to other software application delivery models such as personal finance management software application delivery models, accounting software application delivery models, scholarship application software application delivery models, customer relation management software application delivery models, social media software application delivery models, or any software application delivery models that involve users providing inputs in the form of natural language.

The plurality of word embedding modules may further optionally perform one or more subsequent stage clustering processes to further cluster the plurality of characteristic clusters into one or more super clusters (not shown) each encompassing multiple characteristic clusters. The same subsequent stage clustering may also be performed on the plurality of user clusters to further cluster the plurality of user clusters into one or more user super-cluster that includes multiple user clusters determined by the clustering process at the previous stage.

The vector representations and user clusters as well as characteristic clusters determined may be utilized to generate a personalized flow to interact with a specific user accessing a software application delivery model. For example, a user 104 may provide a specific description in natural language about the user. It shall be noted that the term "user" referred to herein may encompass a natural person or an entity of which the user acts on behalf, unless otherwise explicitly recited or distinguished. This specific description about the user may be provided to the word embedding modules 102 that normalizes and vectorizes into a vector representation. The word embedding modules 102 may then determine one or more user clusters based on the vector representation of the specific description. The word embedding modules 102 may identify a plurality of characteristic clusters (e.g., expense categories) that correspond to at least one user cluster of the one or more identified user clusters.

Once the software delivery model determines the one or more user clusters and the plurality of expense categories, the software delivery model may present one or more personalized screens based on the plurality of expense categories for the user to enter the expenses in addition to or in the alternative of the screen for the standard Schedule C of Form 1040. The software delivery model may additionally or alternatively invoke one or more flow configuration modules 114 to create one or more personalized interviews and/or online chat sessions based in part or in whole upon the one or more user clusters and/or the plurality of expense categories in some embodiments.

The flow configuration modules 114 may reference the additional user feedback during the one or more personalized interviews and/or online chat sessions to customize a personalized flow 118 for the specific user. In formulating the personalized interviews, chat sessions, and/or software application flows, the system may further utilize parameterized templates 116 and populate the personalized interviews, chat sessions, and/or software application flows using the parameterized templates 116 with the specific inputs provided by the user 104.

Figure 2:
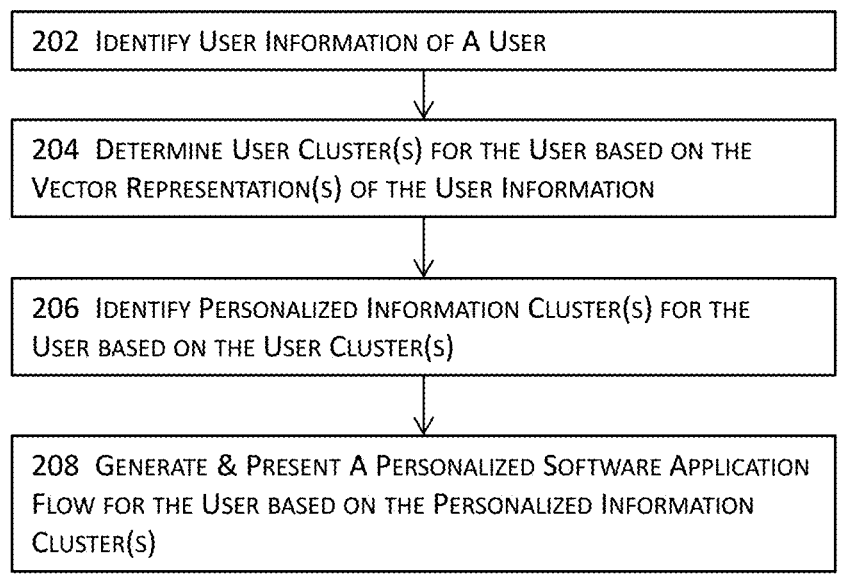
FIG. 2 illustrates a high level flow diagram for generating a personalized flow for a software delivery model in one or more embodiments.

FIG. 2 illustrates a high level flow diagram for generating a personalized flow for a software delivery model in one or more embodiments. In these embodiments, user information about a specific user of a software delivery model may be identified at 202. This user information may be provided by the user in the form of natural language during the user's access of the software delivery model. For example, a user may manually enter the user information in natural language via a keyboard during the use of a software application delivery model. As another example, another user may provide such natural language user information via a microphone as a voice input to a software application delivery model that may further utilize voice recognition and voice transcription modules to transcribe the voice input into the user information. This user information may include description about one or more attributes (e.g., business, profession, title, credentials, etc.) of the user and may be used to cluster the user into one or more user clusters of similar users.

One or more user clusters may be determined at 204 for the specific user based in part or in whole upon the user information identified at 202. More specifically, one or more word embedding modules may be invoked to identify a first corpus comprising user information of a plurality of users, normalize the first corpus into a normalized data set, vectorize a plurality of tokens associated with the plurality of users in the normalized data set into vector representations in a vector space, and cluster the plurality of users into a plurality of user clusters each including multiple similar users whose vector representations are determined to be in close proximity of each other.

The user information identified at 202 may be transformed into a specific vector representation in the same vector space; and one or more word embedding modules may cluster the specific vector representation to determine the one or more user clusters based on, for example, the distance values or similarity scores (e.g., cosine similarity scores) between the specific vector representation and other vector representations in the vector space. More details about normalization, vectorization, and clustering are described in the U.S. patent applications listed in the first paragraph entitled Cross Reference to Related Applications.

For at least one user cluster of the one or more user clusters determined at 204, one or more personalized information clusters may further be determined at 206. More specifically, one or more word embedding modules may identify a second corpus comprising natural language description of personalized information provided by a plurality of users. These one or more word embedding modules may further normalize the second corpus into a second normalized data set, vectorize a second plurality of tokens associated with the natural language description of personalized information in the second normalized data set into second vector representations in a vector space, and cluster the natural language description of personalized information into a plurality of personalized information clusters each including multiple similar natural language descriptions whose vector representations are determined to be in close proximity of each other.

One or more of the personalized information clusters corresponding to the one or more user clusters determined at 204 may be identified at 206 in some embodiments. In these embodiments, these one or more personalized information clusters are determined for users similarly categorized into at least one user cluster.

In some other embodiments where either the user information identified at 202 or other additional information provided by the specific user provides specific details whose clustering results may deviate from or out of the top N (an integer) choices of personalized information clusters, such clustering results may nevertheless be identified at 206 in addition to or in the alternative of the top N choices of personalized information clusters that are determined by clustering a plurality of similar users in the same user cluster with the specific user. In these latter embodiments, the software application delivery model not only appears to better understand but in fact understands the specific user based on the specific details in the user information provided by the specific user.

In addition, although the specific details in the user information may lead to personalized information clusters outside the top N choices of personalized information clusters determined for the user cluster, some or all of these top N choices may nevertheless be presented to the specific user or at least present in a chat session or interview screen to confirm whether or not these top N choices of personalized information clusters are to be presented to the specific user.

In addition, these one or more personalized information clusters may be identified at 206 based in part or in whole upon additional information provided by the user. For example, after a user provides some user information for the description of his business or profession in Schedule C of Form 1040, one or more word embedding modules may determine one or more user clusters for this user as well as a plurality of personalized information clusters (e.g., expense categories). The "Other Expenses" section in Schedule C may nevertheless be presented to the user in addition to the personalized expenses categories. Any additional information that the user enters in this "Other Expenses" section may be similarly processed to determine one or more additional, personalized information clusters.

With these personalized information clusters determined at 206 for the specific user, a personalized software application flow may be generated at 208 and presented to the specific user. To continue with the aforementioned example involving electronic tax return preparation, a series of interviews, an online chat session, or a series of flow nodes may be generated for the specific user to incorporate at least some of the determined personalized information clusters. For example, these techniques may prepare a series of interviews that ask the specific users whether the specific user would like to include one or more specific expense categories because X % of other similar users in similar businesses or professions have claimed in these categories. As another example, one or more screens may be created and populated with pre-filled information about these personalized information clusters while leaving some fields (e.g., expense amounts) for the specific user to fill in or some other fields for the user to modify.

Figure 3:
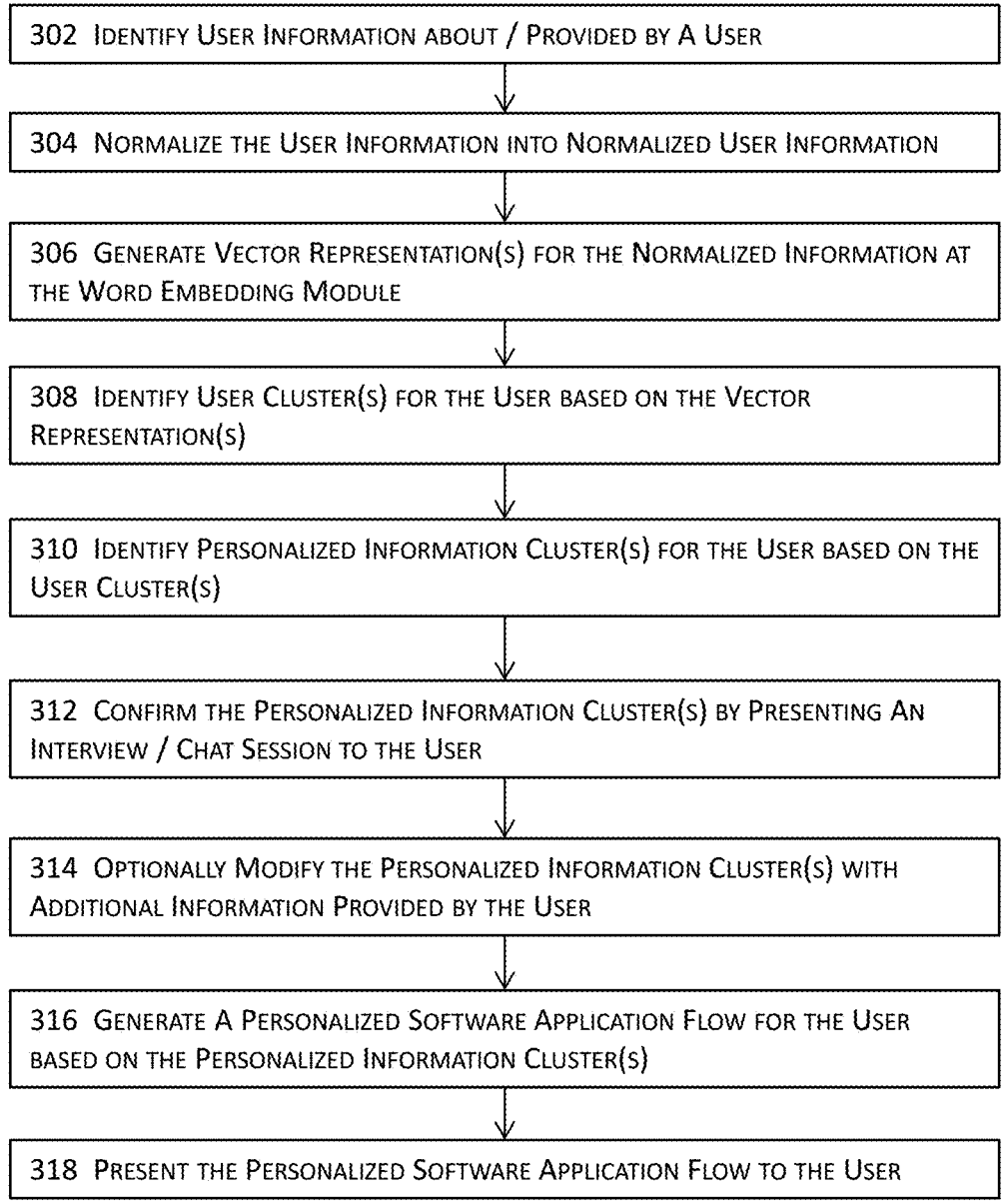
FIG. 3 illustrates a more detailed block diagram for generating a personalized flow for a software delivery model in one or more embodiments.

FIG. 3 illustrates a more detailed block diagram for generating a personalized flow for a software delivery model in one or more embodiments. In these embodiments, user information about or provided by a specific user may be identified at 302. This user information may be entered by the user in a natural language format or transcribed into in a natural language format. The user information identified at 302 may be normalized into normalized user information at 304. For example, the characters in the user information may be mapped to the Unicode expression; letters may be transformed into the lower case; different tenses of the same verb (e.g., fly, flies, flew, flown) may be converted into the same tense (e.g., fly); and/or singular and plurality tokens may be transformed into the same form (e.g., singular); etc.

Normalization may also optionally reduce the size of the user information to reduce the computational resources required to process the user information. For example, punctuations may be removed from the user information; one or more stop words or stop phrases (e.g., one or more function words or function phrases such as auxiliary verbs, certain pronouns such as which, what, etc.), and/or one or more lexical words or lexical phrases that primarily contribute to the grammatical structure or meaning may be filtered out from the user information so that these discarded words are removed from subsequent vectorization and clustering processes.

In addition or in the alternative, names of named entities (e.g., New York Times as the newspaper) may also be optionally extracted although the subsequent word embedding processing may nevertheless learn these names. Word embedding modules described herein may thus discard these filtered out words or phrases that may be determined not to add value or usefulness in subsequent clustering processes. Normalization not only transforms the user information into a standard form but also reduces the size of the user information due to, for example, the transformation of various tenses of verbs into the same tense and transformation of plural nouns into singular forms.

Vector representation for the normalized user information may be generated at 306 by, for example, one or more word embedding modules. In summary, these one or more word embedding modules apply a series of transformations to the normalized user information with variable weight data structures to transform the normalized information into a vector representation in a vector space. These word embedding modules and the variable weight data structures are trained with one or more training instances on a custom dictionary including special terms of art for a software application delivery model; and the one or more training instances are executed in a supervised, unsupervised, or reinforcement leaning environment so that these one or more word embedding modules can produce results with desired accuracy. The normalized information may thus be transformed into a vector representation in the same vector space as other vector representations of other users' provided user information so that the vector representations of similar users (e.g., users in similar businesses or professions) remain in closer proximity. More details about normalization, vectorization, and clustering are described in the U.S. patent applications listed in the first paragraph entitled Cross Reference to Related Applications.

With the vector representation determined for the normalized user information at 306, one or more user clusters may be identified at 308 for the specific user based on the vector representation generated at 306. As described above, one or more word embedding modules transform similar user information into vector representations in closer proximity to each other. A word embedding module may thus examine the vector representation of the normalized information for the specific user and compute the distance values or similarity scores (e.g., scores as measured by cosine similarity) between the vector representation for the specific user and other vector representations. Alternatively, a word embedding module may identify one or more first vector representations that are closest to or are within a threshold distance limit from the vector representation of the specific user in the vector space and cluster the specific user into the same user cluster(s) of these one or more first vector representations.

In some embodiments where more than one user clusters are identified at 308, the process may determine a final user cluster from the identified user clusters by using additional information provided by the user (e.g., through an interview or a chat session or provided by the user in some other section in the software delivery model). For example, the user may also provide additional information (also in natural language format) that may be similarly processed by one or more word embedding modules into one or more vector representations that may be further utilized to fine tune the user cluster determination. In these embodiments, these techniques serve to better understand and serve the users with minimal or no interruption or disturbances to the users while reducing or minimizing the amount of inputs the users need to provide in order to achieve the intended functions of the software application delivery model. In some other embodiments, the final user cluster may be simply validated by the specific user.

With the one or more user clusters identified at 308, a plurality of personalized information clusters may be identified at 310 based in part or in whole upon the one or more user clusters. Continuing with the example involving electronic tax return preparation and filing software delivery model, these personalized information clusters may include expense categories that may be recommended to the specific user. In some embodiments, one or more personalized information clusters may be identified for each user cluster into which the specific user is classified. For example, the top N (an integer) expense categories may be identified for a user cluster and aggregated into the plurality of personalized information clusters identified at 310.

In some other embodiments, the plurality of personalized information clusters may be identified at 308 from some but not all of the one or more user clusters to which the specific user is classified. In some embodiments where other additional information provided by the specific user includes specific details whose clustering results may deviate from or out of the top N expense categories, such deviating clustering results may still be identified in addition to or in the alternative of the top N expense categories that are determined by clustering a plurality of similar users in the same user cluster with the specific user.

As with the user cluster, the plurality of personalized information clusters may be further validated, reduced, or confirmed either with additional information or by user validation at 312. For example, the specific user may also provide additional information in other sections of the software application delivery model. This additional information may be similarly processed by one or more word embedding modules into one or more vector representations; and these one or more vector representations may be further clustered with similar techniques to produce clustering results that may be further used to fine tune the personalized information cluster determination.

In some embodiments, a personalized interview or chat session may be generated and presented to the specific user. These personalized interviews or chat sessions may be controlled on the backend by artificial intelligence modules that dynamically formulate questions based on the answers and intermediate answers provided the specific user. In addition, the same question may be coded in a variety of different manners to add personal, rather than robotic, touch to the personalized interviews and chat sessions.

A personalized interview or chat session may directly ask the specific user to confirm which personalized information clusters are relevant in some embodiments. In some other embodiments, a word embedding module may identify a bifurcation node for the clustering process and interact with an interview module to construct a question that does not directly ask the specific user to confirm which cluster is relevant. Rather, the question is constructed in such a way that guides the clustering process along a specific route at the bifurcation node. For example, when processing the user information, a word embedding module may first determine that the specific user may be a life coach or a sports coach in its clustering process according to the user information provided by the specific user. The word embedding module may thus function in tandem with the interview module or the chat module to formulate a question that asks for specific information that is not the clustering results but leads to a definitive determination between a life coach and a sport coach.

The plurality of personalized information clusters may be optionally modified at 314 with the additional information provided by the specific user. In the example involving the electronic tax return preparation, the specific user may have provided additional natural language information in other sections of Schedule C or even Form 1040. In this example, a word embedding module may similarly process such additional natural language information (e.g., normalization, vectorization, and/or clustering) and use the processing results to fine tune the plurality of personalized information clusters. For example, one or more of the identified plurality of personalized information clusters may be discarded based on such additional information; and one or more other personalized information clusters may be added based on such additional information.

A personalized software application flow with one or more personalized flow nodes through which the specific user may traverse when interacting with the software delivery model may be generated at 316 and presented to the specific user at 318 to enhance the user's experience with the software application delivery model. A flow node represents a flow state that defines the experience that a user will be going through. A flow node may be further associated with one or more functionalities including, for example, one or more input variables to pass information into a flow when the flow starts or one or more modal specifications to allow running an entire flow or a portion thereof in a modal window including a pop-up window. In some embodiments, a default software application flow including a set of default flow nodes may be identified as the basis for the personalized software application flow. One or more flow nodes corresponding to the one or more personalized information clusters may be added to the default software application flow in some embodiments. In some other embodiments, the default software application flow may be modified into the personalized software application flow by replacing one or more default flow nodes with one or more personalized flow nodes corresponding to the one or more personalized information characteristic clusters. In some other embodiments, the default software application flow may be modified into the personalized software application flow by removing one or more default flow nodes from the default software application flow.

Figure 4:
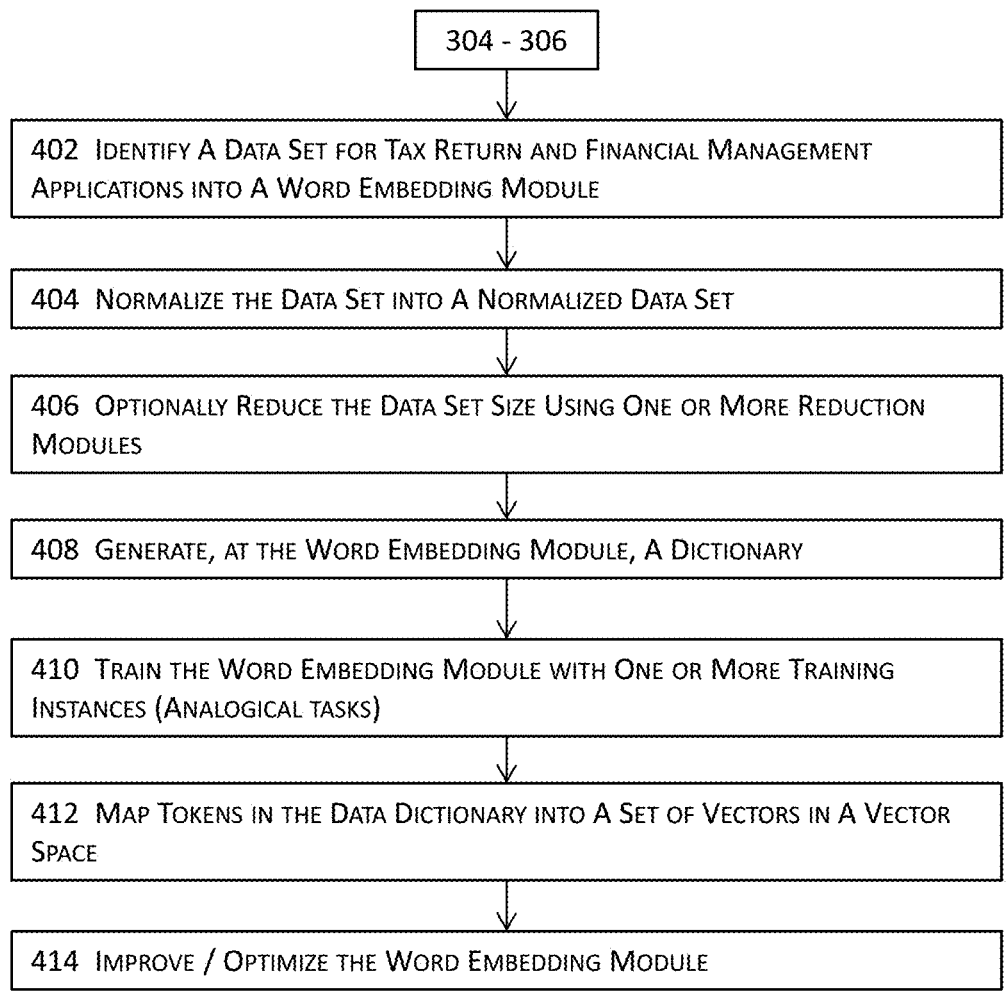
FIG. 4 illustrates more details of a part of the block diagram illustrated in FIG. 3 in some embodiments.

FIG. 4 illustrates more details of a part of the block diagram illustrated in FIG. 3 in some embodiments. More specifically, FIG. 4 illustrates more details about normalization and vectorization (or embedding) of user information at 304 and 306 in FIG. 3. In these embodiments, a corpus or data set including natural language user information (e.g., characters, words, phrases, sentences, paragraphs, and/or documents) for a plurality of users may be identified as an input to a word embedding module at 402. As described above, users may include natural persons, entities such as corporate entities, or a combination of one or more natural persons and one or more entities.

The example flow illustrated in FIG. 4 transforms the corpus, the data set, or a reduced version thereof into vector representations in a vector space where more similar natural language tokens are transformed into vector representations in closer proximity of each other in the vector space having a plurality of dimensions. The corpus or the data set may include a large number of tokens (e.g., billions of words, millions of phrases, etc.) some of which may not necessarily be useful even when transformed into vector representations. On the other hand, vectorizing the corpus or the data set requires computational resources that are proportional to the product of the number of tokens to be vectorized and the degrees of freedom. The corpus or the data set may thus be normalized at 404 into a normalized data set and optionally reduced in size at 406 by using one or more reduction modules.

Normalization of the data set transforms tokens in the corpus or the data set into a normal, canonical, or standard (collectively standard) form that uniquely represents the tokens as well as one or more other equivalent tokens. For example, all characters in the data set may be mapped to the Unicode expression; letters may be transformed into the lower case; different tenses of the same verb (e.g., fly, flies, flew, flown) may be converted into the same tense (e.g., fly); and/or singular and plurality tokens may be transformed into the same form (e.g., singular); etc. Normalization not only transforms tokens into standard forms but also reduces the size of the data set due to, for example, the transformation of various tenses of verbs into the same tense and transformation of plural nouns into singular forms.

One or more data reduction techniques may be applied to the data set during normalization to further reduce its size at 406 in some embodiments. For example, these data reduction techniques may remove punctuations, special characters (e.g., dollar signs), etc. in the natural language user information. In some embodiments, these one or more data reduction techniques may remove words that generally contribute to the grammatical or structural relationships or meaning, rather than semantics. For example, these one or more data reduction techniques may remove one or more stop or function words or phrases (e.g., auxiliary verbs, some pronouns such as which, what, I, we, etc.) and/or one or more lexical or content words or phrases that have little or ambiguous meaning from subsequent processes such as vectorization and clustering. Names of named entities (e.g., New York Times as the newspaper) may also be optionally extracted although the subsequent word embedding processing may nevertheless learn these names. These filtered out words or phrases may be determined not to add value or usefulness in subsequent processes or to result in incorrect clustering results.

For example, a word embedding module may customize a set of stop and/or function words and phrases to include auxiliary verbs (e.g., be verbs, can, must, need, etc.), articles (e.g., the, a, an, etc.), and/or some pronouns (e.g., which, what, etc.) These words primarily contribute to the grammatical meaning of a phrase or sentence but have limited or no usefulness in determining the semantic meaning of the phrase or sentence. In some other embodiments, a word embedding module may iteratively customize the set of stop and/or function words to fit the intended functions of the underlying software application delivery model so as not to mistakenly filtering out words that may actually contribute to determining the similarity of tokens. In some embodiments, some of these words or phrases are not filtered out from further processing. Rather, the word embedding modules may be instructed to assign lower weight values to these words or phrases.

A dictionary or a data structure that includes unique tokens may be optionally generated at 408. These unique tokens in this dictionary or data structure will be forwarded to a word embedding module that transforms these unique tokens into corresponding vector representations in a vector space. Prior to transforming these unique tokens, the word embedding module or the artificial intelligence modules therein may be trained with one or more training instances at 410. A training instance may include one or more analogical reasoning tasks that are applied to the vector representations in the dictionary or data structure to iteratively calibrate the word embedding modules in a supervised, unsupervised, or reinforcement learning environment. More details about training word embedding modules are described in the U.S. patent applications listed in the first paragraph entitled Cross Reference to Related Applications.

In some embodiments, predictive models such as the continuous skip-gram model, continuous-bag-of-words (CBOW), non-linear sigmoidal recurrent neural networks, distributed memory (DM), distributed bag of words (DBOW), etc. may be used with non-uniform, adjustable weight values in the weight data structures (e.g., arrays), instead of a uniform or constant weight value assigned to all tokens in a word embedding module at 410. The training at 410 then iteratively adjusts the weight values of one or more tokens so that the word embedding module under training correctly predicts the answers to the analogical reasoning tasks in the training instances.

The word embedding modules may be derived from Word2vec algorithm, the Doc2vec algorithm, the locally linear embedding (LLE), etc. with adjustable weight data structures that assign lower weights to tokens known to cause incorrect clustering results and/or assign higher weights to tokens that are known to cause more correct or precise clustering results. The use of variable weight values in weight data structures for transforming natural language tokens into vector representations is in sharp contrast with conventional approaches that use an equal weight value for all tokens and thus lead to incorrect or imprecise clustering results for financial management software application delivery models.

Once the word embedding modules are trained to achieve desired accuracy with the one or more training instances at 410, the tokens in the dictionary, the normalized data set, or the reduced, normalized data set may be transformed at 412 into corresponding vector representations where more similar tokens are transformed into vector representations that are in closer proximity to each other in the vector space.

The word embedding modules may further be optionally improved or optimized at 414 using techniques such as the hierarchical softmax technique, the negative sampling technique, the softmax technique, the noise contrastive estimation (NSE) technique, the subsampling of frequent words technique, etc. to reduce the number of updates per training instance or per training task. These improvement or optimization techniques thus further reduce the utilization of computational resources.

For example, a word embedding module may invoke the hierarchical softmax technique that uses a Huffman tree to reduce computation intensity, especially targeting infrequent tokens. As another example, a word embedding module may invoke the negative sampling technique that minimizes the log-likelihood of sampled negative instances, especially for frequent tokens. In addition or in the alternative, subsampling of frequent words during training may also be utilized to result in speedup and improve accuracy of the vector representations of less frequent tokens.

The dimensionality of the vector space may also be improved or optimized. Generally, the quality of word embedding increases as the dimensionality of the vector space increases. Nonetheless, the increase in quality of word embedding slows down as the dimensionality of the vector space reaches a threshold number beyond which the accuracy results in a limited return that is disproportional to the increase in dimensionality and hence in computational intensity. Therefore, the word embedding module may impose a threshold limit on the dimensionality of the vector space to further conserve computational resources.

The word embedding modules may also impose a limit on the context for the aforementioned predictive models. The context imposes a limit on a number of tokens before and a number of tokens after a given token for predictions. For example, a word embedding module may limit the context to 10 when continuous skip-gram is utilized and to 5 when CBOW is utilized. More details about normalization and vectorization are described in the U.S. patent applications listed in the first paragraph entitled Cross Reference to Related Applications.

Figure 5A:
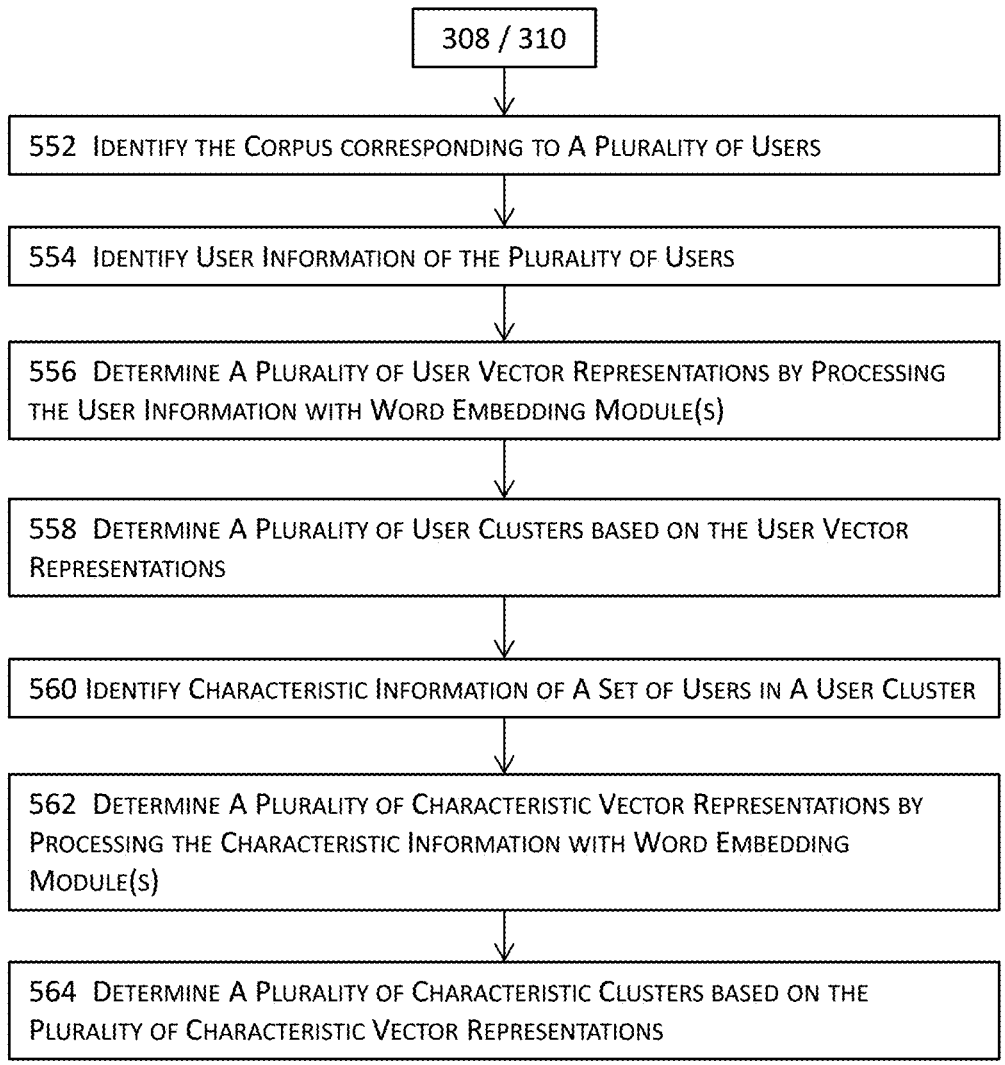
FIGS. 5A-5B illustrate more details of another part of the block diagram illustrated in FIG. 3 in some embodiments.
Figure 5B:
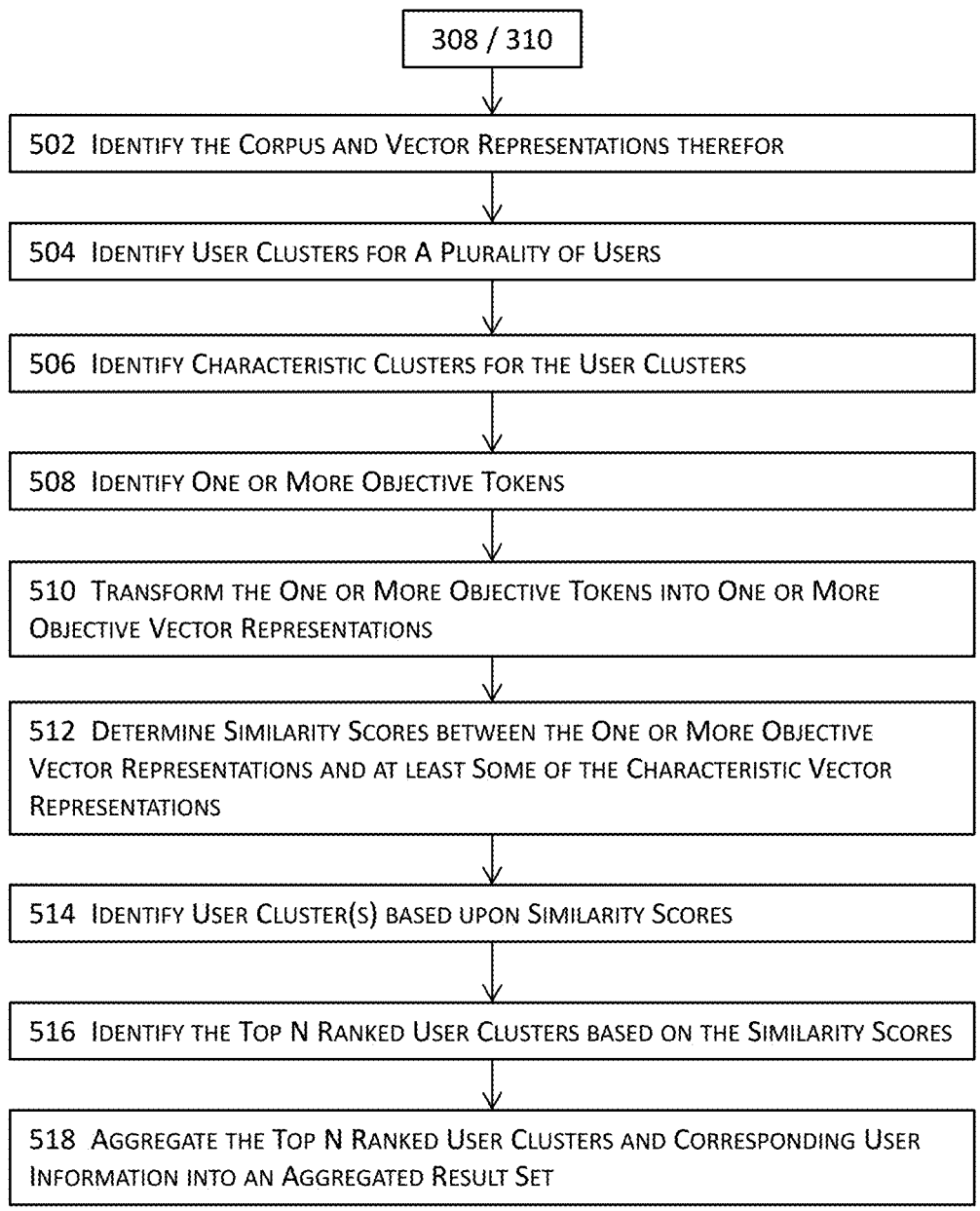

FIGS. 5A-5B illustrate more details of another part of the block diagram illustrated in FIG. 3 in some embodiments. More specifically, FIGS. 5A-5B illustrate more details about the clustering process at 308 and 310 of FIG. 3. One of the objectives of a clustering process is to classify similar natural language descriptions into the same cluster. These techniques as illustrated in FIG. 5A utilize a multi-stage clustering process that first clusters users into one or more user clusters at the first clustering stage by normalizing and vectorizing a first corpus. For a user cluster, the multi-stage clustering process further clusters a plurality of characteristics pertaining to the users in the user cluster into one or more characteristic clusters (e.g., one or more personalized information clusters as described above).

In these embodiments, a corpus corresponding to a plurality of users associated with a plurality of characteristics may be identified at 552. At 554, user information about or provided by the plurality of users may be identified. The multi-stage clustering process may the process the user information at 556 into a plurality of user vector representations with one or more word embedding modules. For example, these one or more word embedding modules may normalize the user information into normalized user information and vectorizes the normalized user information into a plurality of user vector representations where user vector representations in closer proximity of each other indicate more similar user information that corresponds the user vector representations. More details about normalizing and vectorizing user information are described above with reference to FIG. 4 as well as the U.S. patent applications listed in the first paragraph entitled Cross Reference to Related Applications.

The one or more word embedding modules may cluster the plurality of users into a plurality of user clusters at 558 by using the user vector representations of the user information in the corpus. More precisely, these one or more word embedding modules may determine the distance values between the user vectors and classify users that are within certain close proximity into a user cluster in some embodiments. In some other embodiments, these one or more word embedding modules may determine similarity scores among the user vector representations by computing a similarity score as measured by the cosine similarity as well as the magnitudes of the user vector representations. In some other embodiments, the similarity scores may be determined by using the angular similarity and angular distance or any other suitable measures to gauge the close proximity of vector representations in a vector space.

With the plurality of user clusters each having a group of similar users determined at 558, the one or more word embedding modules may further identify characteristic information of a group of similar users in a user cluster at 560. This identified characteristic information may be similarly processed into a group of characteristic vector representations at 562 by using the one or more word embedding modules that normalize the characteristic information into normalized characteristic information and vectorize the normalized characteristic information into the group of characteristic vector representations for the group of users in a user cluster. The one or more word embedding modules may also cluster the group of characteristic vector representations into one or more characteristic clusters for the user group at 564.

Similar to the clustering of the plurality of users into a plurality of user vector representations, these one or more word embedding modules may determine the distance values between the characteristic vector representations and classify the characteristic vector representations that are within certain close proximity into a characteristic cluster in some embodiments. In some other embodiments, these one or more word embedding modules may determine similarity scores among the characteristic vector representations by computing a similarity score as measured by the cosine similarity as well as the magnitudes of the characteristic vector representations. In yet some other embodiments, the similarity scores may be determined by using the angular similarity and angular distance or any other suitable measures to gauge the close proximity of vector representations in a vector space.

In some other embodiments, this multi-stage clustering process may further cluster the corpus with respect to one or more objective tokens that are provided to the word embedding modules as inputs. The word embedding modules normalize and vectorize these objective tokens into objective vector representations, identify the characteristic vector representations in close proximity to the objective vector representations into an objective characteristic cluster, and identify one or more user clusters that correspond to the identified objective characteristic cluster.

As a practical example involving an electronic tax return preparation and filing software application delivery model, an object token such as "cell phone carrier service charges" may be provided to the word embedding modules. The first stage clustering may be performed on a plurality of expense clusters to identify the top N expense clusters that are more similar to the provided object token ("cell phone carrier service charges"). Because each user cluster may be associated with a number of expense clusters from previous clustering, the user clusters corresponding to the top N expense clusters may then be identified. This process is illustrated in FIG. 5B as described below.

In some embodiments, a corpus including information of a plurality of users and the corresponding vector representations therefor may be identified at 502. The corpus may be specifically designed to include at least the words, phrases, sentences, etc. that may be referenced in the realm of a software application delivery model and is unlike some general corpus from sources such as a collection of news articles that is often used in conventional natural language processing approaches. The vector representations for the corpus as well as the user clusters and characteristic clusters may be determined with the flow illustrated in FIGS. 3-4 described above.

A plurality of user clusters for the plurality of users may be identified at 504 by using the techniques described above with reference to FIGS. 3-4. In addition, a plurality of characteristic clusters (e.g., personalized information clusters described above with reference to FIGS. 2-3) may also be identified at 506 for the plurality of user clusters. In some embodiments, one or more characteristic clusters may be identified at 506 for each user cluster of the plurality of user clusters identified at 504.

With the user clusters and characteristic clusters identified, one or more objective tokens may be identified at 508. These one or more objective tokens may be provided to a word embedding token as the basis for clustering and may thus be transformed into one or more objective vector representations at 510. The similarity scores (e.g., score as measured by cosine similarity) between these one or more object vector representations and the characteristic clusters or between these one or more object vector representations and characteristic vector representations may be determined at 512.

The similarity score between an object vector representation and a characteristic cluster may be determined by computing the cosine similarity measure between the object vector representation and the exemplar of the characteristic cluster in some embodiments. An exemplar includes a natural language characteristic data item in the corpus that is selected to represent the characteristic cluster. Each characteristic may thus corresponds to its own exemplar. In some other embodiments, similarity score between an object vector representation and a characteristic cluster may be determined by computing the cosine similarity measures between the object vector representation and each of a plurality of characteristic vector representations in the characteristic cluster.

With the one or more similarity scores determined, one or more characteristic clusters may be identified. For example, the top N characteristic clusters having the highest N similarity scores with the one or more objective tokens may be identified. Because the plurality of users represented in the corpus have been clustered into a plurality of user clusters, each corresponding to a plurality of characteristic clusters, one or more user clusters may thus be identified based in part or in whole upon the similarity scores at 514.

Because the same characteristic cluster may be ranked differently in different user clusters, the top N user clusters having the most numbers or highest percentages of users may be identified at 516. In some other embodiments, the user clusters in which the characteristic cluster is ranked as the top N characteristic clusters may be identified at 514. For example, "cell phone charge" may be ranked as the second highest expense category for a first user cluster having 5,000 users and may be ranked as the fifth highest expense category for a second user cluster having 200,000 users. In some embodiments, the first user cluster may be identified at 514 due to the ranking of "cell phone charge" for the first user cluster. In some other embodiments, the second user cluster may be identified at 514 due to the sheer number of users in this user cluster. The identified user clusters and their corresponding user information may then be aggregated into an aggregated result set at 518. More details about clustering are described in the U.S. patent applications listed in the first paragraph entitled Cross Reference to Related Applications.

Figure 6A:
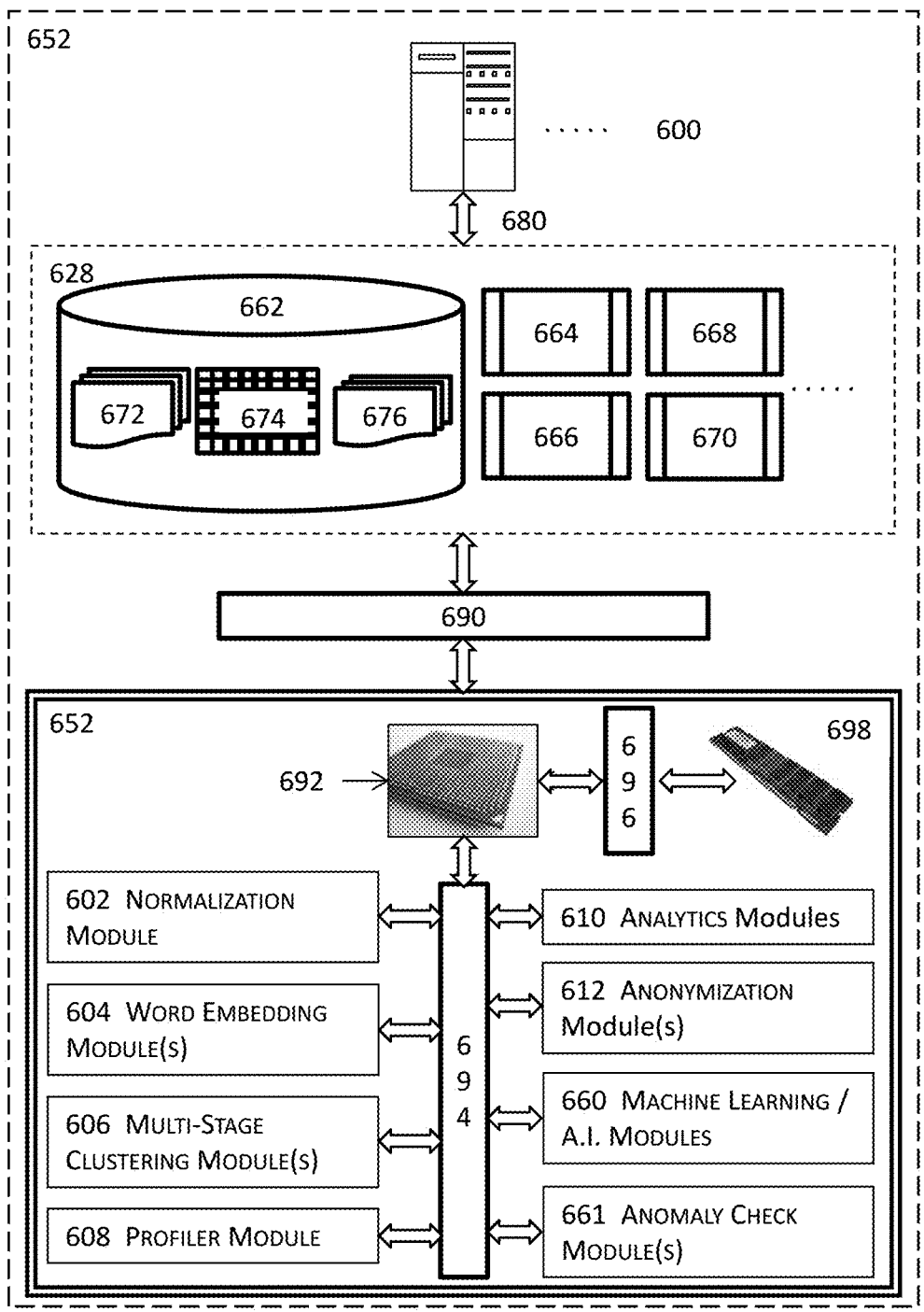
FIG. 6A illustrates an example of a computing system that is configured with specific modules to generate a personalized flow for a software delivery model in one or more embodiments.

FIG. 6A illustrates an example of a computing system that is configured with specific modules to generate a personalized flow for a software delivery model in one or more embodiments. More specifically, FIG. 6A illustrates an illustrative high level schematic block diagrams for a system for generating a personalized flow for a software delivery model and may comprise one or more computing systems 600, such as a general purpose computer described in the System Architecture Overview section to implement one or more special proposes. The illustrative system in FIG. 6A may include an Internet-based computing platform providing a shared pool of configurable computer processing resources (e.g., computer networks, servers, storage, applications, services, etc.) and data to other computers and devices in an ubiquitous, on-demand basis via the Internet. For example, one or more computing resources and/or modules illustrated in FIG. 6A may be located in a cloud computing platform in some embodiments.

In some embodiments, the one or more computing systems 600 may invoke various system resources such as the processor(s) or processor core(s), memory, disks, etc. The one or more computing systems 600 may also initiate or interact with other computing systems to access, via a computer bus architecture (e.g., a system bus, a control bus, a data bus, or any combinations thereof), various resources 628 that may comprise a database engine 664, a flow controller 666, a flow instance resolver 668, a flow action controller 670, etc. that are coupled to the set of modules 652 to aid the generation, control, and execution of personalized flows of software application delivery models.

The one or more computing systems 600 may further write to and read from a local or remote non-transitory computer accessible storage 662 that stores thereupon data or information such as, but not limited to, one or more databases or data structures (674) such as one or more natural language information data structures, vector representations data structures, clustering result data structures, personalized flow data structures, etc., various statistics, various data or information, various constraints, etc. (672), or other information or data (676) that may be used to facilitate the performance of various functions to achieve the intended purposes.

In some embodiments, the one or more computing systems 600 may include or, either directly or indirectly through the various resources 628, invoke a set of modules 652 including hardware modules and software modules or combinations of one or more hardware modules and one or more software modules that may comprises one or more normalization modules 602 that normalize an input data set of a plurality of data items into a normalized data set, one or more word embedding modules 604 that embed various pieces of information into a vector space. In some embodiments, the one or more normalization modules 602 may be a part of one or more word embedding modules 604.

The set of modules 652 may further optionally include one or more multi-stage modules 606 to cluster various pieces of information into one or more clusters (e.g., user clusters, characteristic clusters, personalized information clusters, etc.) The set of modules 652 may also include one or more profiling modules 608 to generate profiles for users and to aggregate various other information or data (e.g., vector representations, clustering results, etc.)

The set of modules 652 may also include one or more analytics modules 610 to perform analytics on one or more corpora and/or on various vector representations in tandem with, for example, one or more word embedding modules 604. The set of modules 652 may also include one or more anonymization modules 612 to anonymize or de-sensitize various pieces of information or data. to In addition or in the alternative, this set of modules 652 may include one or more machine learning or artificial intelligence (A.I.) modules 660 to that may be used to train the one or more normalization modules 602, the word embedding modules 604, and/or the multi-stage clustering modules 606. More details about training one or more of these modules are described in the U.S. patent applications listed in the first paragraph entitled Cross Reference to Related Applications. The set of modules 652 may also include one or more anomaly check modules 661 to perform various checks on a software application delivery model. For example, an anomaly check module 661 may check the data entered by users to determine whether the entered data (e.g., expense description, expense amounts, etc. in an electronic tax return preparation and filing software application delivery model) includes any anomalies.

In some embodiments, the computing system 600 may include the various resources 628 such that these various resources may be invoked from within the computing system via a computer bus 680 (e.g., a data bus interfacing a microprocessor 692 and the non-transitory computer accessible storage medium 698 or a system bus 690 between a microprocessor 692 and one or more engines in the various resources 628). In some other embodiments, some or all of these various resources may be located remotely from the computing system 600 such that the computing system may access the some or all of these resources via a computer bus 680 and one or more network components.

The computing system may also include one or more modules in the set of modules 652. One or more modules in the set 652 may include or at least function in tandem with a microprocessor 692 via a computer bus 694 in some embodiments. In these embodiments, a single microprocessor 692 may be included in and thus shared among more than one module even when the computing system 600 includes only one microprocessor 692. A microprocessor 692 may further access some non-transitory memory 698 (e.g., random access memory or RAM) via a system bus 696 to read and/or write data during the microprocessor's execution of processes.

System Architecture Overview

Figure 6B:
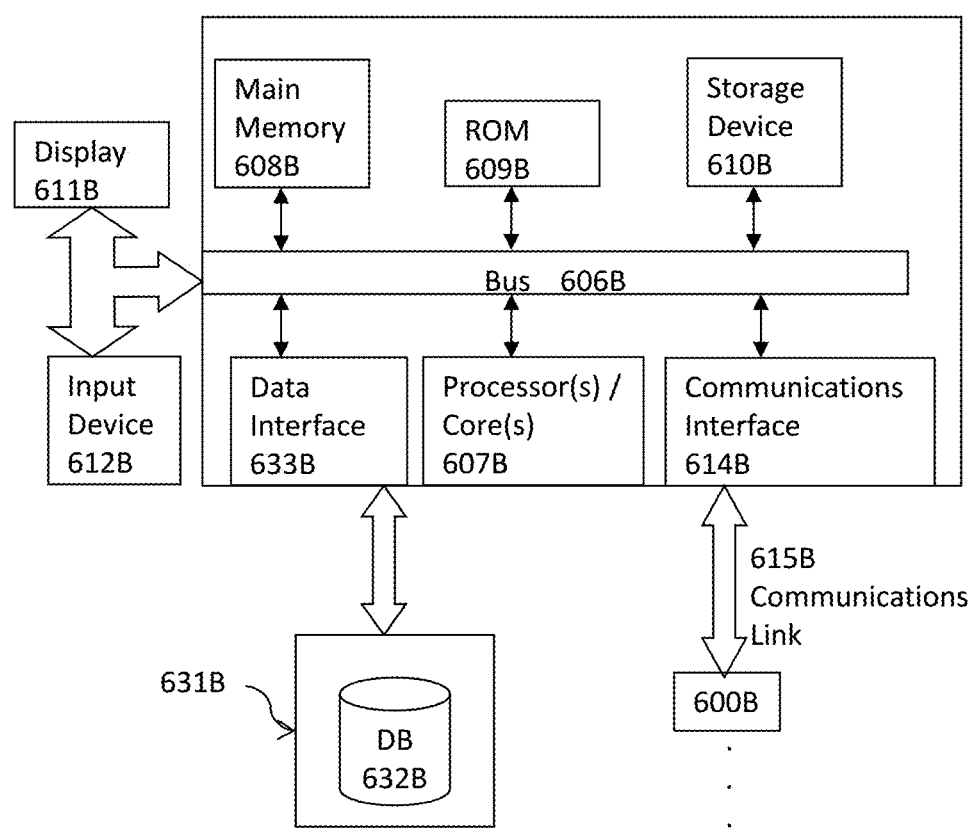
FIG. 6B illustrates a computerized system on which a method for generating a personalized flow for a software delivery model may be implemented in one or more embodiments.

FIG. 6B illustrates a block diagram of an illustrative computing system 600B suitable for generating a personalized flow for a software delivery model as described in the preceding paragraphs with reference to various figures. The illustrative computing system 600B may include an Internet-based computing platform providing a shared pool of configurable computer processing resources (e.g., computer networks, servers, storage, applications, services, etc.) and data to other computers and devices in an ubiquitous, on-demand basis via the Internet. For example, the computing system 600B may include or may be a part of a cloud computing platform in some embodiments. Computer system 600B includes a bus 606B or other communication module for communicating information, which interconnects subsystems and devices, such as processor 607B, system memory 608B (e.g., RAM), static storage device 609B (e.g., ROM), disk drive 610B (e.g., magnetic or optical), communication interface 614B (e.g., modem or Ethernet card), display 611B (e.g., CRT or LCD), input device 612B (e.g., keyboard), and cursor control (not shown).

According to one embodiment, computing system 600B performs specific operations by one or more processor or processor cores 607B executing one or more sequences of one or more instructions contained in system memory 608B. Such instructions may be read into system memory 608B from another computer readable/usable storage medium, such as static storage device 609B or disk drive 610B. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607B, where the one or more processors, one or more processor cores, or combination thereof executes one or more threads. For example, various acts of identifying, various acts of determining, various acts of classifying, various acts of implementing, various acts of performing, various acts of transforming, various acts of decomposing, various acts of updating, various acts of presenting, various acts of modifying, etc. may be performed by one or more processors, one or more processor cores, or combination thereof.

A modules described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a module described herein may be implemented as an application-specific integrated circuit (ASIC) in some embodiments.

In these embodiments, a module may thus include, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of module. A module described herein or an equivalent thereof may perform its respective functions alone or in conjunction with one or more other modules. A module described herein or an equivalent thereof may thus invoke one or more other modules by, for example, issuing one or more commands or function calls. The invocation of one or more other modules may be fully automated or may involve one or more user inputs.

The term "computer readable storage medium" or "computer usable storage medium" as used herein refers to any non-transitory medium that participates in providing instructions to processor 607B for execution. Such a medium may take many forms, including but not limited to, non-volatile media and volatile media. Non-volatile media includes, for example, optical or magnetic disks, such as disk drive 610B. Volatile media includes dynamic memory, such as system memory 608B. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600B. According to other embodiments of the invention, two or more computer systems 600B coupled by communication link 615 (e.g., LAN, PTSN, or wireless network) may perform the sequence of instructions required to practice the invention in coordination with one another.

Computer system 600B may transmit and receive messages, data, and instructions, including program, i.e., application code, through communication link 615B and communication interface 614B. Received program code may be executed by processor 607B as it is received, and/or stored in disk drive 610B, or other non-volatile storage for later execution. In an embodiment, the computing system 600B operates in conjunction with a data storage system 631B, e.g., a data storage system 631B that includes a database 632B that is readily accessible by the computing system 600B. The computing system 600B communicates with the data storage system 631B through a data interface 633B. A data interface 633B, which is coupled with the bus 606B, transmits and receives electrical, electromagnetic or optical signals that include data streams representing various types of signal information, e.g., instructions, messages and data. In embodiments of the invention, the functions of the data interface 633B may be performed by the communication interface 614B.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for generating a personalized flow for a software delivery model, comprising:
   identifying, at one or more word embedding modules including or coupled with at least one micro-processor of a server coupled to a user computing device through a computer network component, user information of a specific user, the user information expressed in natural language;
   determining, at the one or more word embedding modules, one or more user clusters for the specific user, the one or more user clusters each including a plurality of users clustered with the user based in part or in whole upon at least one user vector representation of a form of the user information;
   identifying, at the one or more word embedding modules, one or more personalized information clusters for a user cluster of the one or more user clusters based in part or in whole upon the at least one user vector representation; and
   generating and presenting a personalized software application flow to the specific user using at least the one or more personalized information clusters for the specific user.

2. The computer implemented method of claim 1, further comprising:
   identifying the user information from the user computing device of the specific user through the computer network component;
   normalizing the user information into normalized user information; and
   generating, at the one or more word embedding modules, the at least one user vector representation for the normalized user information of the specific user.

3. The computer implemented method of claim 2, further comprising:
   identifying additional user information of a plurality of users;
   normalizing the additional user information into additional normalized user information;
   generating, at the one or more word embedding modules, a plurality of user vector representations for the additional normalized user information of the plurality of users; and
   determining, at the one or more word embedding modules, a plurality of user clusters by processing at least the plurality of user vector representations for the plurality of users.

4. The computer implemented method of claim 3, further comprising:
   identifying characteristic information of a group of users in a user cluster of the one or more user clusters; and
   transforming the characteristic information of the group of users in the user cluster into a plurality of characteristic vector representations at least by normalizing the characteristic information into normalized characteristic information and vectorizing the normalized characteristic information.

5. The computer implemented method of claim 4, further comprising:
   determining one or more characteristic clusters for the group of users based in part or in whole upon the plurality of characteristic vector representations; and
   identifying, at the one or more word embedding modules, the one or more personalized information clusters for the specific user from the one or more characteristic clusters for the specific user.

6. The computer implemented method of claim 5, further comprising:
   verifying the one or more personalized information clusters by presenting at least one interview session or a chat session to a user interface of the software delivery model.

7. The computer implemented method of claim 6, further comprising:
   identifying additional natural language information of the specific user;
   normalizing the additional natural language information into normalized additional natural language information;
   transforming the normalized natural language information into one or more additional vector representations; and
   modifying the one or more personalized information clusters by determining an addition or removal of at least one personalized information cluster using at least the one or more additional vector representations for the addition natural language information.

8. The computer implemented method of claim 1, further comprising:
normalizing user information of a plurality of users stored in a central repository into normalized user information; and
reducing a size of the user information or the normalized user information by applying one or more data reduction techniques to the user information or the normalized user information.

9. The computer implemented method of claim 1, further comprising:
identifying a plurality of analogical reasoning tasks comprising one or more vector arithmetic operations, one or more additive compositionality operations, or one or more combinations of the one or more vector arithmetic operations and one or more additive compositionality operations;
determining one or more training instances with at least the plurality of analogical reasoning tasks; and
training the one or more word embedding modules by executing the one or more training instances for the one or more word embedding modules in a supervised, unsupervised, or reinforcement learning environment.

10. The computer implemented method of claim 1, further comprising:
identifying one or more corpora including user information and characteristic information of a plurality of users;
identifying or determining a plurality of user vector representations for the user information in the one or more corpora; and
identifying or determining a plurality of user clusters based in part or in whole upon the plurality of user vector representations for the user information in the one or more corpora.

11. The computer implemented method of claim 10, further comprising:
identifying or determining a plurality of characteristic vector representations for the characteristic information in the one or more corpora; and
identifying or determining a plurality of characteristic clusters for at least one user cluster of the plurality of user clusters based in part or in whole upon the plurality of characteristic vector representations for the characteristic information in the one or more corpora.

12. The computer implemented method of claim 11, further comprising:
identifying one or more objective tokens;
transforming the one or more objective tokens into one or more objective vector representations at the one or more word embedding modules;
determining similarity scores between the one or more objective vector representations and at least some of the plurality of characteristic vector representations;
identifying one or more target user clusters based in part or in whole upon the similarity scores; and
aggregating at least one target user cluster of the one or more target user clusters and corresponding characteristic information into an aggregated result set.

13. The computer implemented method of claim 1, generating and presenting the personalized software application flow comprising:
invoking a software flow configuration module in the software delivery model;
identifying a default software application flow comprising a set of default flow nodes for the software application delivery model; and
modifying the default software flow at least by adding one or more flow nodes that correspond to the one or more personalized information clusters to the default software application flow, wherein the one or more flow nodes includes an interview screen or a chat session encompassing information about the one or more personalized information clusters.

14. The computer implemented method of claim 13, generating and presenting the personalized software application flow further comprising:
modifying the default software application flow at least by removing one or more default flow nodes from the default software application flow.

15. A system for generating a personalized flow for a software delivery model, comprising:
a server computer comprising a plurality of modules, at least one of which functions in tandem with at least one microprocessor including one or more processor cores executing one or more threads in the server computer;
a non-transitory computer accessible storage medium storing thereupon program code that includes a sequence of instructions that, when executed by the at least one microprocessor of the server computer, causes the at least one microprocessor at least to:
identify, at one or more word embedding modules including or coupled with at least one micro-processor of a server coupled to a user computing device through a computer network component, user information of a specific user, the user information expressed in natural language;
determine, at the one or more word embedding modules, one or more user clusters for the specific user, the one or more user clusters each including a plurality of users clustered with the user based in part or in whole upon at least one user vector representation of a form of the user information;
identify, at the one or more word embedding modules, one or more personalized information clusters for a user cluster of the one or more user clusters based in part or in whole upon the at least one user vector representation; and
generate and presenting a personalized software application flow for the specific user using at least the one or more personalized information clusters for the specific user.

16. The system of claim 15, wherein the program code includes further instructions that, when executed by the at least one micro-processor or processor core, cause the at least one processor or processor core to normalize user information of a plurality of users stored in a central repository into normalized user information, and to reduce a size of the user information or the normalized user information by applying one or more data reduction techniques to the user information or the normalized user information.

17. The system of claim 16, wherein the program code includes further instructions that, when executed by the at least one micro-processor or processor core, cause the at least one processor or processor core to identify a plurality of analogical reasoning tasks comprising one or more vector arithmetic operations, one or more additive compositionality operations, or one or more combinations of the one or more vector arithmetic operations and one or more additive compositionality operations, to determine one or more training instances with at least the plurality of analogical reasoning tasks, and to train the one or more word embedding modules by executing the one or more training instances for the one or more word embedding modules in a supervised, unsupervised, or reinforcement learning environment.

18. The system of claim 15, wherein the program code includes further instructions that, when executed by the at least one micro-processor or processor core, cause the at least one processor or processor core to identify one or more corpora including user information and characteristic information of a plurality of users, to identify or determine a plurality of user vector representations for the user information in the one or more corpora, to identify or determine a plurality of user clusters based in part or in whole upon the plurality of user vector representations for the user information in the one or more corpora, to identify or determine a plurality of characteristic vector representations for the characteristic information in the one or more corpora, and to identify or determine a plurality of characteristic clusters for at least one user cluster of the plurality of user clusters based in part or in whole upon the plurality of characteristic vector representations for the characteristic information in the one or more corpora.

19. The system of claim 15, wherein the program code includes further instructions that, when executed by the at least one micro-processor or processor core, cause the at least one processor or processor core to invoke a software flow configuration module in the software delivery model, to identify a default software application flow comprising a set of default flow nodes for the software application delivery model, to modify the default software flow at least by adding one or more flow nodes that correspond to the one or more personalized information clusters to the default software application flow, wherein the one or more flow nodes includes an interview screen or a chat session encompassing information about the one or more personalized information clusters, and to modify the default software application flow at least by removing one or more default flow nodes from the default software application flow.

20. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for generating a personalized flow for a software delivery model, the set of acts comprising:
identifying, at one or more word embedding modules including or coupled with at least one micro-processor of a server coupled to a user computing device through a computer network component, user information of a specific user, the user information expressed in natural language;
determining, at the one or more word embedding modules, one or more user clusters for the specific user, the one or more user clusters each including a plurality of users clustered with the user based in part or in whole upon at least one user vector representation of a form of the user information;
identifying, at the one or more word embedding modules, one or more personalized information clusters for a user cluster of the one or more user clusters based in part or in whole upon the at least one user vector representation; and
generating and presenting a personalized software application flow for the specific user using at least the one or more personalized information clusters for the specific user.

21. The article of manufacture of claim 20, the set of acts further comprising:
invoking a software flow configuration module in the software delivery model;
identifying a default software application flow comprising a set of default flow nodes for the software application delivery model;
modifying the default software flow at least by adding one or more flow nodes that correspond to the one or more personalized information clusters to the default software application flow, wherein the one or more flow nodes includes an interview screen or a chat session encompassing information about the one or more personalized information clusters; and
modifying the default software application flow at least by removing one or more default flow nodes from the default software application flow.

22. The article of manufacture of claim 20, the set of acts further comprising:
identifying one or more corpora including user information and characteristic information of a plurality of users;
identifying or determining a plurality of user vector representations for the user information in the one or more corpora; and
identifying or determining a plurality of user clusters based in part or in whole upon the plurality of user vector representations for the user information in the one or more corpora.

23. The article of manufacture of claim 22, the set of acts further comprising:
identifying or determining a plurality of characteristic vector representations for the characteristic information in the one or more corpora; and
identifying or determining a plurality of characteristic clusters for at least one user cluster of the plurality of user clusters based in part or in whole upon the plurality of characteristic vector representations for the characteristic information in the one or more corpora.

24. The article of manufacture of claim 23, the set of acts further comprising:
identifying one or more objective tokens;
transforming the one or more objective tokens into one or more objective vector representations at the one or more word embedding modules;
determining similarity scores between the one or more objective vector representations and at least some of the plurality of characteristic vector representations;
identifying one or more target user clusters based in part or in whole upon the similarity scores; and
aggregating at least one target user cluster of the one or more target user clusters and corresponding characteristic information into an aggregated result set.

* * * * *